United States Patent [19]

Vyne

[11] Patent Number: 4,606,781
[45] Date of Patent: Aug. 19, 1986

[54] METHOD FOR RESISTOR TRIMMING BY METAL MIGRATION

[75] Inventor: Robert L. Vyne, Tempe, Ariz.

[73] Assignee: Motorola, Inc., Schaumburg, Ill.

[21] Appl. No.: 662,109

[22] Filed: Oct. 18, 1984

[51] Int. Cl.[4] .......................................... H01L 21/24
[52] U.S. Cl. ..................................... 148/183; 29/584; 29/585; 29/586; 148/187; 204/129.2; 204/140; 357/51; 357/68
[58] Field of Search ............... 357/51, 68; 148/1.5, 148/33, 183, 187; 29/584, 585, 586; 204/140, 129.2

[56] References Cited

U.S. PATENT DOCUMENTS

| | | | |
|---|---|---|---|
| 2,916,408 | 12/1959 | Freedman | 148/183 |
| 3,206,340 | 9/1965 | Stelmak | 148/183 X |
| 3,333,326 | 8/1967 | Thomas et al. | 29/584 X |
| 3,474,530 | 10/1969 | Ainslie et al. | 148/183 X |
| 3,548,269 | 12/1970 | MacDougall et al. | 29/576 X |
| 3,576,549 | 4/1971 | Hess et al. | 29/586 X |
| 3,593,069 | 7/1971 | Madden | 357/51 |
| 3,629,782 | 12/1971 | Sahni | 357/51 X |
| 3,717,852 | 2/1973 | Abbas et al. | 29/584 X |
| 3,769,559 | 10/1973 | Dorler et al. | 29/586 X |
| 3,775,838 | 12/1973 | Dalmasso | 29/577 R |
| 3,781,977 | 1/1974 | Hulmes | 29/584 |
| 3,930,304 | 1/1976 | Keller et al. | 29/586 |
| 3,947,866 | 3/1976 | Stellrecht | 357/51 |
| 4,134,808 | 1/1979 | Kruger et al. | 204/129.2 |
| 4,191,964 | 3/1980 | Kant | 357/51 |
| 4,377,423 | 3/1983 | Anthony | 148/1.5 X |
| 4,381,598 | 5/1983 | Anthony | 148/1.5 X |
| 4,411,708 | 10/1983 | Winham | 148/187 X |
| 4,412,241 | 10/1983 | Nelson | 357/51 |
| 4,446,613 | 5/1984 | Beinglass et al. | 29/571 |
| 4,467,312 | 8/1984 | Komatsu | 148/1.5 X |
| 4,534,100 | 8/1985 | Lane | 148/183 X |
| 4,549,912 | 10/1985 | Anthony | 29/584 X |

Primary Examiner—George T. Ozaki
Attorney, Agent, or Firm—Joe E. Barbee

[57] ABSTRACT

A method for trimming a diffused or implanted resistor located within an integrated circuit is disclosed. This technique for trimming a resistor requires the use of high current pulses and geometric shaped metal contacts. The current pulses react with the electropositive metal atoms in the thin film conductor and cause the metal atoms to migrate to another location, thus altering the value of the resistor by progressively decreasing the conductivity of the resistor.

7 Claims, 11 Drawing Figures

METHOD FOR RESISTOR TRIMMING BY METAL MIGRATION

BACKGROUND OF THE INVENTION

This invention relates, in general, to a method for trimming an electrical component that is located within an integrated circuit and, more particularly, to a method for trimming implanted or diffused resistors by the use of metal migration.

The term "trimming" is used to mean the fine adjustment of resistance, capacitance, or inductance in a circuit. As used herein, "metal migration" refers to the movement of metal into a semiconductor crystal (e.g. a resistor). This movement of metal is caused by sending current pulses through the resistor. These pulses are usually of high amplitude and small pulse width.

In the manufacture and packaging of integrated circuits, it is sometimes necessary to "match" (make electrically identical) resistors, transistors, diodes or to set the absolute value of a single electronic device to a certain value, such as trimming a resistor to set a particular current level. For example, trimming of component values on an integrated circuit chip can result in minimizing the input offset voltage of an operational amplifier, or its temperature coefficient of input offset voltage. Trimming of a voltage reference can set the output voltage and temperature coefficient to precise values. Trimming of D/A or A/D converters is commonly done in order to obtain increased accuracy.

Resistor trimming is by far the most common means of adjusting electrical parameters of integrated circuits. Two methods are generally used. The first is to use a trim potentiometer outside the semiconductor device but connected to it through external pins, i.e. on a printed circuit board. The second method is to trim a resistor on the integrated circuit die itself.

In the prior art, electronic components, e.g. resistors, have been trimmed by mechanical, electrical, or chemical means. For example, mechanical means include abrasion, usually by sandblasting, and laser-shaping of a conductive layer. Electrical means include fuse blowing, i.e. vaporization of metal by passing high current therethrough and short-circuiting diodes with excessive current. The latter is also known as "zener zapping" since the diodes connected along the resistive elements are zener diodes. Chemically changing the conductivity of the resistor by anodizing the metal is possible but not often used in a production environment.

The known methods of resistor trimming on the die have serious disadvantages. The cost of laser trimming equipment is high. The maintenance and programming of such equipment are extremely critical and costly. Fuse blowing can cause surface contamination and cracks in the protective glass layer which, in turn, cause reliability problems. Zener zapping can require that over twenty per cent of the die be dedicated to resistor trimming.

A further disadvantage in the known methods of resistor trimming on the die is that after the die is trimmed (usually in wafer form) it is scribed and assembled in a package. This assembly process can put stress on the semiconductor chip which can cause the trimmed resistor to change due to piezoresistive effects. It would, therefore, be advantageous to be able to trim an on chip resistor after the integrated circuit die is in the package.

SUMMARY OF THE INVENTION

It is an object of this invention to provide a method for adjusting the value of an electrical component that is located within an integrated circuit by the use of the phenomenon known as metal migration.

Another object of the present invention is to reduce the amount of circuitry that is needed to trim a resistor.

A further object of the present invention is to be able to trim resistors after the die has been sealed in the package.

According to an aspect of the invention there is provided a method for trimming the values of a passive device located within an integrated circuit which includes forming metal contacts at each end of a resistor and causing an electrical current to flow through the resistor in a single direction only. The current causes the metal to migrate from one contact region to the contact region at the opposite end of the resistor. The electrical current is then terminated after a predetermined time.

According to a further aspect of the invention there is provided a semiconductor device including first and second contact regions having mirror apexes.

A more complete understanding of the present invention can be attained by considering the following detailed description in conjunction with the accompanying drawings.

DETAILED DESCRIPTION OF THE INVENTION

It is well known in the art that a resistor is constructed on an integrated circuit by implanting or diffusing dopants into a semiconductor material through apertures in a masking material. The contacts are formed by depositing an insulating layer over the resistor region. Openings, called preohmics, are etched into the insulating layer at each end of the resistor. A layer of metal is deposited over the insulating layer and into the preohmics, thus making contacts with the resistor. The shape of the preohmic defines the shape of the metal contact.

Pulsating a direct current through the metal contacts of the diffused resistor results in a metal filament controllably migrating from the positive contact to the negative contact. As the metal migrates through the silicon, the value of the resistor changes. A contact with a sharp corner or a corner with a small radius of curvature will allow the metal to migrate with less current than, for example, a circular contact with a large radius.

The term "contact" refers to the metal region that is touching the resistor region. The geometric metal contacts located on each end of the resistor are also identified as "primary contacts" since they are the ones through which current is supplied. As is more clear from the detailed description herein, additional or secondary contacts are located intermediate the primary contacts. These are not used for supplying current, but merely respond to the current flowing between the primary contacts.

The secondary contacts and the positive primary contact migrate metal at the same time if all the preohmics have the same radius of curvature at the point where the metal begins to migrate. This is important because it defines the geometry of the filament, which is necessary for long term stability of the resistor.

It also has been determined that the geometry of the filament will be determined by the direction of the resistor relative to the crystallographic planes in the wafer substrate, and by the direction of current flow in the resistor.

Figure 1:
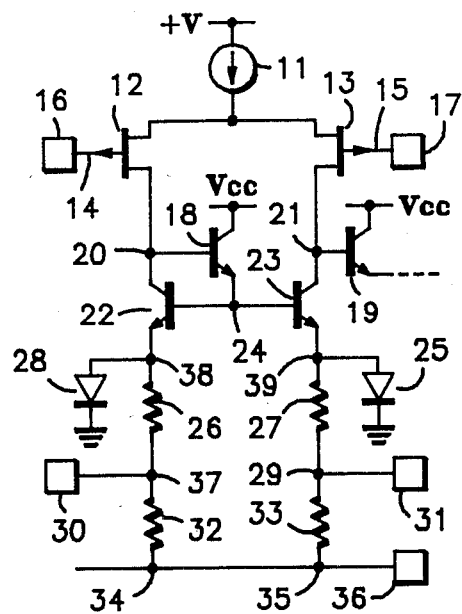
FIG. 1 is a schematic diagram of a typical J-FET operational amplifier in which the present invention can be used.

FIG. 1 illustrates a portion of a typical operational amplifier in which trimmable resistors 32 and 33 are used. Resistors 32 and 33 are trimmed by applying positive pulses to pads 30 or 31. Resistors 26 and 27 along with diodes 28 and 25 protect transistors 22 and 23 from damage during the resistor trim routine. Trimming resistors can also be found in regulators, multipliers, and filters, among other applications. Thus, the circuit of FIG. 1 is representative and not exhaustive of the uses of the present invention.

Current source 11 is connected to the sources of transistors 12 and 13. Bonding pads 16 and 17 are connected to transistors 12 and 13 by way of gate terminals 14 and 15, respectively. The bases of transistors 18 and 19 are connected to nodes 20 and 21 respectively. Nodes 20 and 21 are located between the drains of transistors 12 and 13 and the collectors of transistors 22 and 23 respectively. Node 24 is located between the base of transistor 22 and the base of transistor 23. The emitter of transistor 18 is connected to node 24. The collectors of transistors 18 and 19 are connected to a suitable power supply illustrated as $V_{CC}$. The emitter of transistor 19 is connected to the next stage in the amplifier, not shown. The emitters of transistors 22 and 23 are connected to nodes 38 and 39, respectively. Diode 28 is connected to node 38 and diode 25 is connected to node 39. Diode 28 and 25 are grounded. Nodes 38 and 39 are connected to resistors 26 and 27, respectively. Resistor 26, pad 30 and resistor 32 are connected to node 37. Resistor 27, pad 31, and resistor 33 are connected to node 29. Resistor 32 and 33 are connected to nodes 34 and 35. respectively. Nodes 34 and 35 are connected to ground pad 36.

The operation of such amplifiers is well known per se in the art and will only be discussed in detail in connection with the trimming of resistors 32 and 33.

Figure 2:
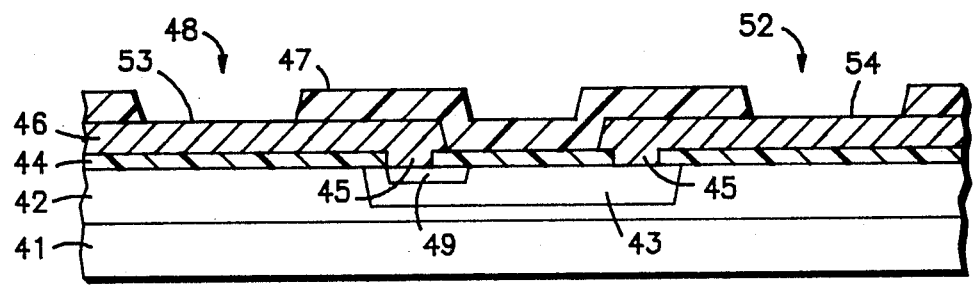
FIG. 2 illustrates a sectional side view of a resistor.
Figure 3:
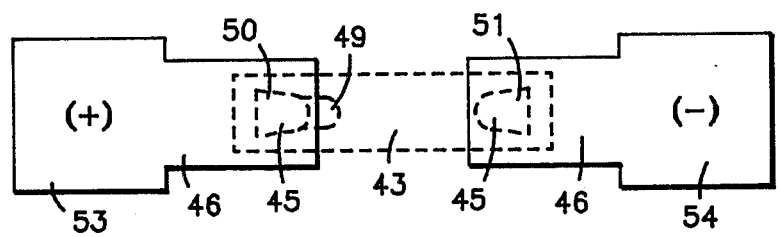
FIG. 3 illustrates the top view of the resistor of FIG. 2.

FIG. 2 is a sectional view of the various layers that make up a diffused resistor. In this embodiment, substrate 41 comprises a P-type silicon layer covered by an N-type epitaxial layer 42. Resistor 43 comprises an N-type dopant that is diffused into epitaxial layer 42. Insulating layer 44 preferably comprises nitride, although other insulators could be used, and is deposited over the epitaxial layer 42. Openings 45 are etched into nitride layer 44. Metal layer 46 is deposited over the nitride layer and in openings 45, thus creating metal contacts 50 and 51 (FIG. 3). Protective glass layer 47 is deposited over the metal, and openings 48 and 52 are etched into glass layer 47 to provide access to pads 53 and 54. FIG. 3 does not show the protective glass layer.

When a pulsating current is connected across pads 53 and 54, the metal begins to migrate from metal contact 50, in resistor 43, towards metal contact 51 as represented by region 49. Typical values for current are 250 to 300 milliamps with a range of 250 to 650 milliamps, depending on the resistor characteristics. This current is far in excess of the current flowing through the resistor during normal operation of the amplifier, e.g. 100 microamperes. The metal migrates as shown by 49 in the same direction as hole flow and opposite to electron flow. In FIG. 3, pad 53 is connected to a positive voltage source and pad 54 is connected to a negative voltage source or ground. A resistor is trimmed to a given value by adjusting the duration and amount of current passing through it as well as by adjusting the number of current pulses. It is possible to completely short the resistor by pulsing the current for an extended length of time.

Figure 4:
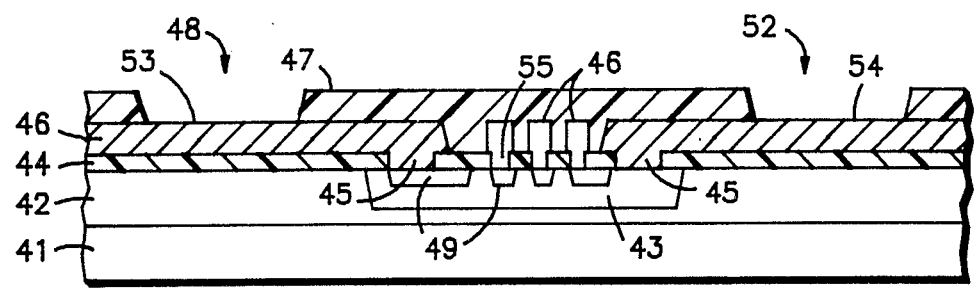
FIG. 4 illustrates a sectional side view of a resistor with additional metal contacts.
Figure 5:
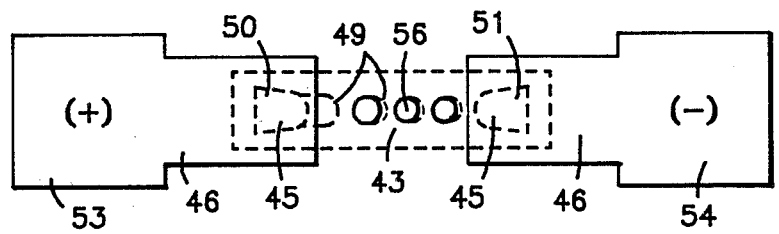
FIG. 5 illustrates the top view of the resistor of FIG. 4.

While suitable in many applications, the embodiment of FIGS. 2 aad 3 is more suited to small changes in resistance. If region 49 is caused to grow significantly, e.g. greater than the size of the primary contact as measured in the same direction, then some drift may be encountered in operation of the device. To correct for the drifting value, a further embodiment of this invention is shown in FIGS. 4 and 5.

In this embodiment, a plurality of secondary contacts are added so that the migration is spread over several regions located more or less along a straight line between the primary contacts. Substrate 41 is covered by epitaxial layer 42. Resistor 43 is diffused into epitaxial layer 42. Insulating layer 44 preferably comprises nitride, is located on top of the epitaxial layer. Openings 45 and 55 are etched into nitride layer 44. Openings 55 may have any shape and are merely illustrated as circular in shape. Metal 46 is deposited over the nitride and into 45 and 55, thus creating metal contacts 50, 51, and 56. Contacts are known as secondary contacts. Protective glass layer 47 is deposited over the metal, and openings 48 and 52 are etched into the glass to provide access to pads 53 and 54. FIG. 5 does not show the protective glass layer. Applying a pulsating current having a positive polarity at pad 53 and a negative polarity at pad 54 the metal begins to migrate from metal contact 50, toward metal contact 51 as illustrated by regions 49. Each of the circular metal contacts 56 has metal migrating toward contact 51. During trim, these secondary contacts produce shorter average filament lengths, which has been found to stabilize the trimmed resistor value during high temperature life tests.

Figure 6:
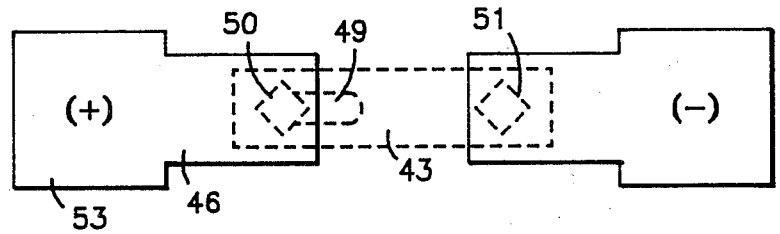
FIGS. 6–8 illustrate the top view of a resistor with alternate geometric contacts.
Figure 7:
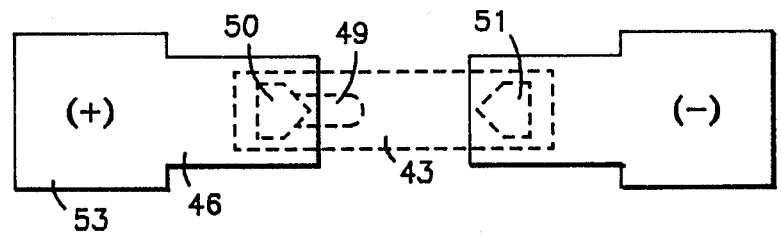
Figure 8:
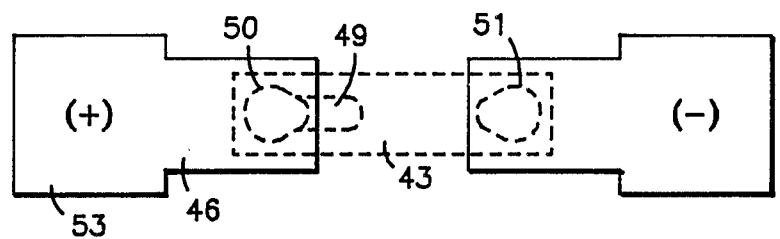

FIGS. 6-8 illustrate alternative embodiments of shapes for primary contacts 50 and 51. Secondary contacts may be added or not, as desired. The primary contacts are also characterized by mirrored apexes pointing at each other and having a radius of curvature which is small relative to the size of the contact.

Figure 9:
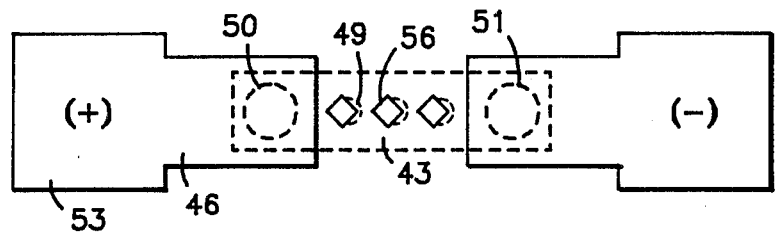
FIGS. 9–11 illustrate the top view of a resistor with additional metal contacts.
Figure 10:
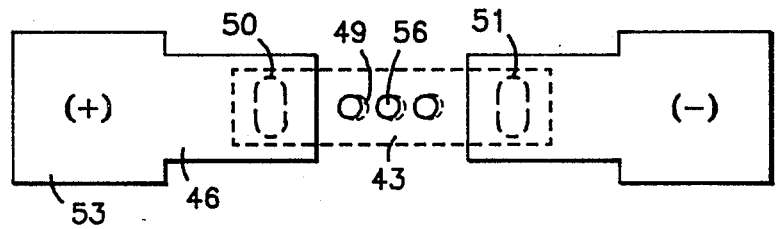
Figure 11:
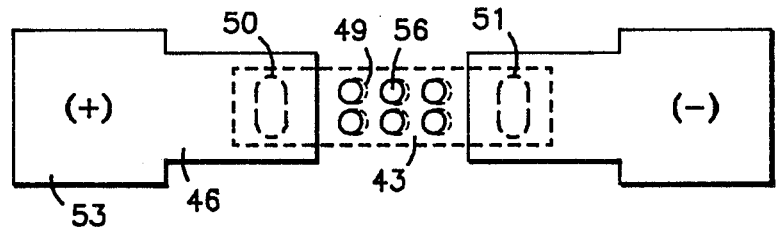

In an alternative embodiment of the present invention illustrated in FIGS. 9–11, there is no migration from the primary contacts. In addition, secondary contacts are located between the primary contacts and are of a design to allow the metal to migrate. This embodiment prevents the occurrence of an open circuit at the primary contact region.

A number of variations in the hasic process are possible. Substrate 41 can be N-type and epitaxial layer 42 a P-type layer. Resistor 43 can be implanted and/or be P-type. Insulating layer 44 can comprise oxide or a combination of oxide and nitride or polyimide. Metal layer 46 can comprise pure aluminum, aluminum alloy such as aluminum copper, aluminum silicon, or aluminum copper silicon or other metal. The protective layer can comprise doped silicon dioxide, silicon nitride, plasma silicon, polyimide, or the like.

The advantages of resistor trimming by metal migration (RTMM) are numerous. Conventional processes and test equipment can be used to manufacture and trim the diffused RTMM resistor, unlike expensive thin film processes with laser trim. The migrating metal occurs in the silicon body of the RTMM resistor, which does not damage the protective passivation on the surface of the I.C. chip. This is not the case with laser trim or fuse blowing techniques. For laser trimming, elaborate test programs must be written to increment the laser to the proper targets. RTMM does not require this. Trimming by zener zapping requires complicated circuitry along with high voltage protection schemes. Also, it consumes typically twenty per cent of the total die area. Trimming with RTMM requires very little die area. Trimming with the RTMM resistor can be done after the I.C. chip is sealed in the package, which will trim out any inaccuracies caused by package stresses. Since RTMM is an analog trimming method, much more accuracy can be achieved with computer control than can be achieved by zener zapping on the die.

There is thus provided by the present invention as an improved method for trimming resistors. It requires no special processing and produces more accurate resistors.

Having thus described the invention, it will be apparent to those skilled in the art that various modifications can be made within the spirit and scope of the present invention. For example, while the pre-ohmic holes are illustrated as uniformly spaced in FIGS. 4, 5, and 9–11, they need not be. Also, as previously discussed, the present invention can be implemented in a variety of semiconductor materials and conductivity types.

What is claimed is:

1. A method for trimming the values of a passive device formed at the surface of a semiconductor substrate, comprising the steps of:
    forming metal contact regions at least at each end of said device;
    causing an electrical current to flow through said device in a single direction only, said current being sufficient to cause metal to migrate from at least one contact region toward another contact region; and
    terminating said electrical current after a predetermined length of time.

2. The method as defined in claim 1, in which said passive device comprises a resistor.

3. The method as defined in claim 2, in which said passive device comprises a diffused resistor.

4. The method as defined in claim 2, in which said passive device comprises an ion implanted resistor.

5. The method as defined in claim 1, in which a plurality of contacts are formed between said contact regions.

6. The method as defined in claim 1 in which said contact regions each comprise an apex further comprising the steps of forming first and second contact regions with said apexes pointing at each other.

7. A method of trimming a resistor found in a semiconductor substrate as part of an integrated circuit, comprising:
    forming at least first and second contacts for making contact to the resistor; and
    applying a pulsating current between the first and second contacts, and causing metal migration to occur from the first contact to the second contact due to the pulsating current thereby changing the ohmic value of the resistor to a determined value.

* * * * *